United States Patent

Pawlenko

Patent Number: 6,053,084
Date of Patent: Apr. 25, 2000

[54] SYSTEM AND METHOD FOR CUTTING PANELS

[75] Inventor: Ivan Pawlenko, Holland, Pa.

[73] Assignee: Lucent Technologies, Inc., Murray Hill, N.J.

[21] Appl. No.: 09/192,157

[22] Filed: Nov. 13, 1998

[51] Int. Cl.[7] ................................................. H05K 3/02
[52] U.S. Cl. .................. 83/23; 83/155; 83/364; 83/468.6; 83/929.1; 83/420; 83/421; 83/435; 83/425; 83/732; 83/446; 83/449; 83/492; 83/503; 83/507; 83/676; 29/846
[58] Field of Search ................................ 83/13, 23, 51, 83/155, 209, 268, 282, 364, 468.6, 468.7, 979.1, 418, 435, 477.1, 425, 869, 158, 160, 367, 368, 391, 732, 449, 492, 503, 507, 508.2, 495, 445, 446, 440, 591, 663, 676, 876, 885, 420, 421, 426, 482; 29/846, 848, 851

[56] References Cited

U.S. PATENT DOCUMENTS

| | | | |
|---|---|---|---|
| 1,569,649 | 1/1926 | Way | 83/391 |
| 2,222,051 | 11/1940 | Tyrrell | 83/481 |
| 3,882,772 | 5/1975 | Geisow et al. | 101/4 |
| 3,922,937 | 12/1975 | Maddox | 83/99 |
| 3,972,262 | 8/1976 | Albert, Jr. | |
| 4,648,298 | 3/1987 | Sutton | 83/62 |
| 4,679,473 | 7/1987 | Hirata et al. | 83/157 |
| 4,709,608 | 12/1987 | Vietrogoski | 83/355 |
| 4,742,615 | 5/1988 | Lopez | 29/846 |
| 4,830,554 | 5/1989 | Lopez | 409/164 |
| 4,846,032 | 7/1989 | Jampathom et al. | 83/51 |
| 4,856,400 | 8/1989 | Kelzer | 83/885 |
| 4,985,982 | 1/1991 | Lohr et al. | 29/566.001 |
| 5,099,979 | 3/1992 | Kehrel | 198/345.1 |
| 5,214,992 | 6/1993 | Mohr | 83/268 |
| 5,435,218 | 7/1995 | Martin | 83/176 |
| 5,467,677 | 11/1995 | Kinson, Jr. | 83/155 |
| 5,577,428 | 11/1996 | Rueb | 83/449 |
| 5,598,757 | 2/1997 | Lloyd et al. | 83/23 |

*Primary Examiner*—Rinaldi I. Rada
*Assistant Examiner*—Boyer Ashley
*Attorney, Agent, or Firm*—Woodridge & Associates, P.C.; Richard C. Woodridge; Thomas J. Onka

[57] ABSTRACT

This invention relates to a system and method for cutting circuit board panels utilizing an in-line cutting mechanism. As the panel is transported into the cutting mechanism, adjustable rails are moved into position to properly guide the panel into the cutting head. The actual cutting operation is performed by transporting the panel between an upper cutting disk blade and a lower cutting disk blade. The distance between these two blades is adjustable and permits precision cutting of the panel with minimal stress to the circuit board and its components.

12 Claims, 5 Drawing Sheets

SYSTEM AND METHOD FOR CUTTING PANELS

BACKGROUND OF THE INVENTION

1. Field of the Invention

This invention relates to a technique for cutting a panel, such as a circuit board or the like.

2. Description of Related Art

In the process of manufacturing circuit boards there are various situations in which it is necessary to cut circuit board panels. One such situation involves separating a large panel partitioned into multiple printed circuit boards. Another situation relates to the fact that many circuit boards carry at least one edge connector for connecting the board to an external system. During circuit board fabrication, the board is punched to create a cut-out in its edge for each connector. Typically, the edge connector cut-outs are only partially formed, leaving a thin web of material in what would otherwise be the opening ("throat") of each cut-out. Typically, these webs are integral with each other, effectively forming an elongated tab at the edge of the board. To fully form the edge connector cut-outs, the tab must be cut, thereby removing the web from each cut-out.

A number of methods and devices are known and available for cutting circuit board panels. Two such methods involve the use of a band saw or router. These methods impart vibrations to the printed circuit board, however. These vibrations propagate across the board and, in turn, may cause damage to the solder junctions electrically connecting the components mounted to the board. Also certain surface mounted components are very susceptible to the vibrations from such a band saw and may be easily damaged thereby.

High precision shearing is an alternative method for performing this cutting operation. This method also produces vibration to the circuit board and stress on solder joints. Further, the nature of the shearing operation causes a stress perpendicular to the cut edge that distorts the circuit board in a manner that produces a tendency for delamination to occur along this cut edge over a period of time.

Moreover, these and other prior art methods of cutting circuit boards panels rely on complicated methods of routing the circuit board into the cutting station. Frequently, this handling of the panels and panel portions involved sensing, gripping, and indexed feeding of the panels and panel portions under the control of a programmable computer or sophisticated hardware device. Thus, there is a need for a technique for cutting a circuit board that avoids the need to off-load and/or re-orient the board to the cutting mechanism and for performing the actual cutting in a manner that minimizes stress to the board's components and connections and further, reduces delamination effects over time.

SUMMARY OF THE INVENTION

Briefly, in accordance with the invention, a method is provided for cutting a panel, such as a circuit board substrate, to remove a tab running along its edge or to divide it into pre-partitioned circuit boards. The method is initiated by transporting the panel into a cutting mechanism that is in-line with the panel, thereby obviating the need to move or even raise/lower the panel to match the height of the cutting mechanism. As the panel is transported into the cutting mechanism by a first conveyor, adjustable guide rails are extended to guide the panel into the cutting mechanism. After cutting, the cut sections of the panel are transported from the cutting mechanism by a second conveyor.

The actual cutting operation is performed using a pair of disk cutters oriented one directly above the other, between which cutters the panel is transported for cutting. The separation of the cutters is adjustable to accurately perform the cutting operation in a manner that produces a minimum of stress on the panel.

These and other features of the invention will be more fully understood by reference to the following drawings.

DETAILED DESCRIPTION OF THE INVENTION

During the course of this description, like numbers will be used to identify like elements according to different figures which illustrate the invention.

Figure 1:
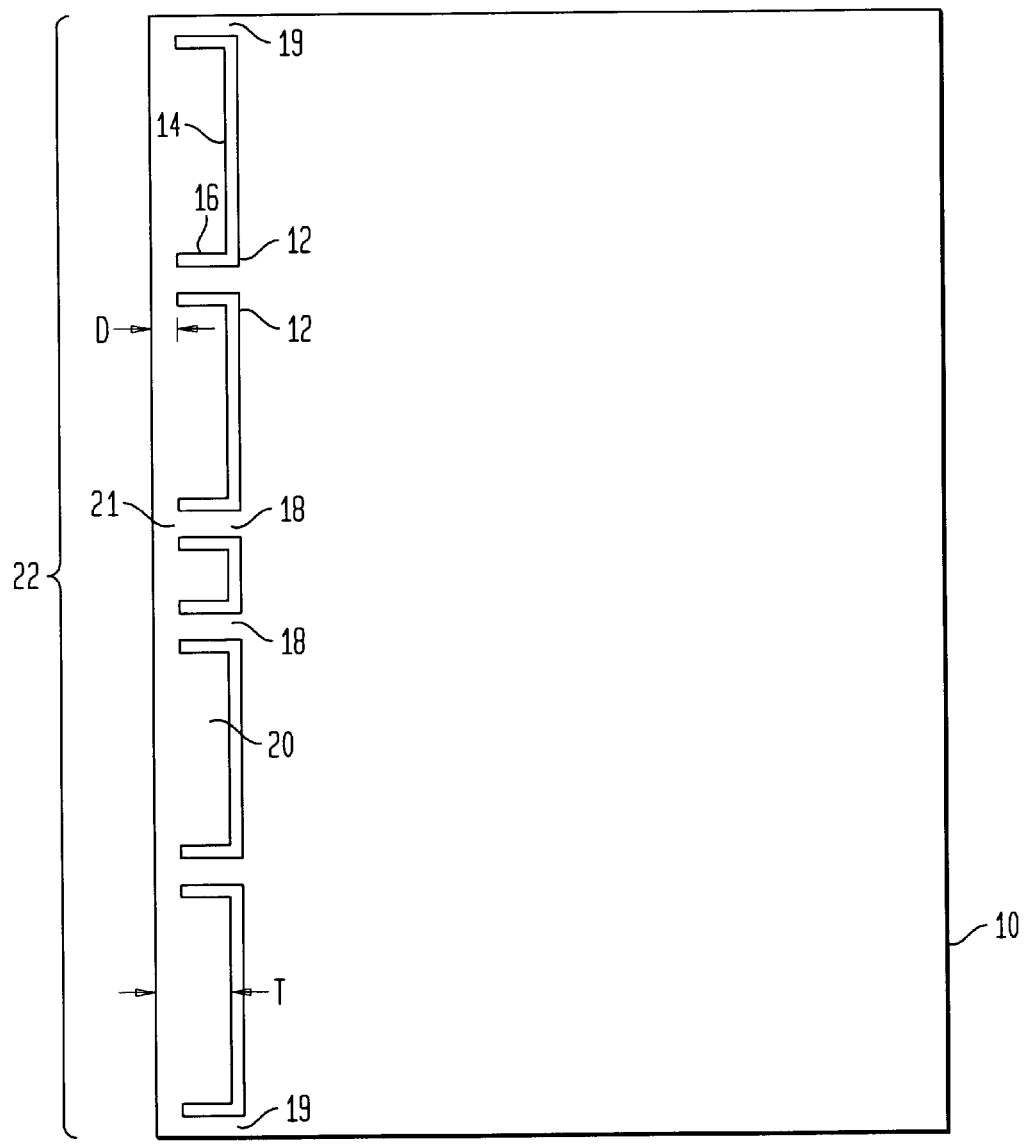
FIG. 1 is a plan view of a circuit board according to the prior art.

The invention will first be described with respect to the operation of removing a tab running along an edge of a circuit board panel. FIG. 1 depicts a prior art panel 10 which, in the illustrated embodiment, comprises a circuit board that carries one or more components (not shown). The circuit board 10 of FIG. 1 has a plurality of partially formed cut-outs 12, each comprised of a longitudinal open portion or channel 14 and a pair of lateral open channels 16. Each lateral channel 16 extends at a right angle from one of the ends of the longitudinal channel 14 and runs towards, but ends a short distance D from, the left-hand edge of the circuit board 10 as seen in FIG. 1. The longitudinal channel 14 of each cut-out is typically aligned with the longitudinal channel of the other cut-outs, whereas the lateral channels 16 of the cut-outs are parallel to each other. A narrow strip 18 separates each lateral channel 16 from a neighboring lateral channel while a narrow strip 19 separates one of the lateral channels 16 of each upper and lower cut-out 12 from the upper and lower edges, respectively, of the circuit board 10.

Lying to the left of the longitudinal channel 14 of each cut-out 12 is a web 20 having a width T corresponding to the throat of the cut-out. Each web 20 is joined to each adjacent web by an integral band 21. The combination of the webs 20 and bands 21 yield an elongated tab 22 that forms the left-hand edge of the circuit board 10. Once the tab 22 is separated from the circuit board 10, each web 20 is thus removed from the throat of each cut-out 12, leaving the throat open to receive an edge connector (not shown). As may be appreciated, with the tab 22 removed, the board narrower than before by the width D of the bands 21 of the now-removed tab.

Figure 2:
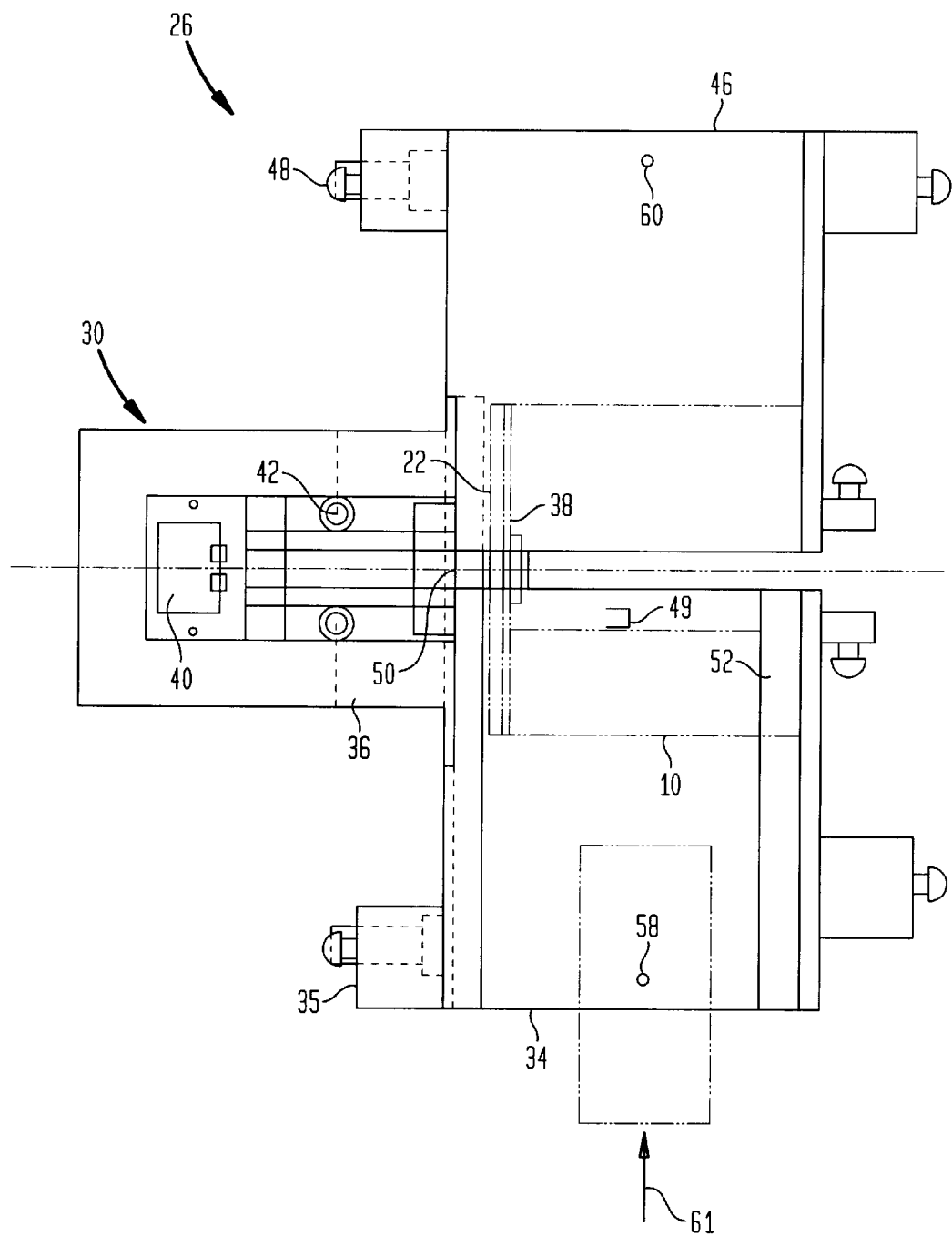
FIG. 2 is a plan view of a cutting system in accordance with the invention.
Figure 3:
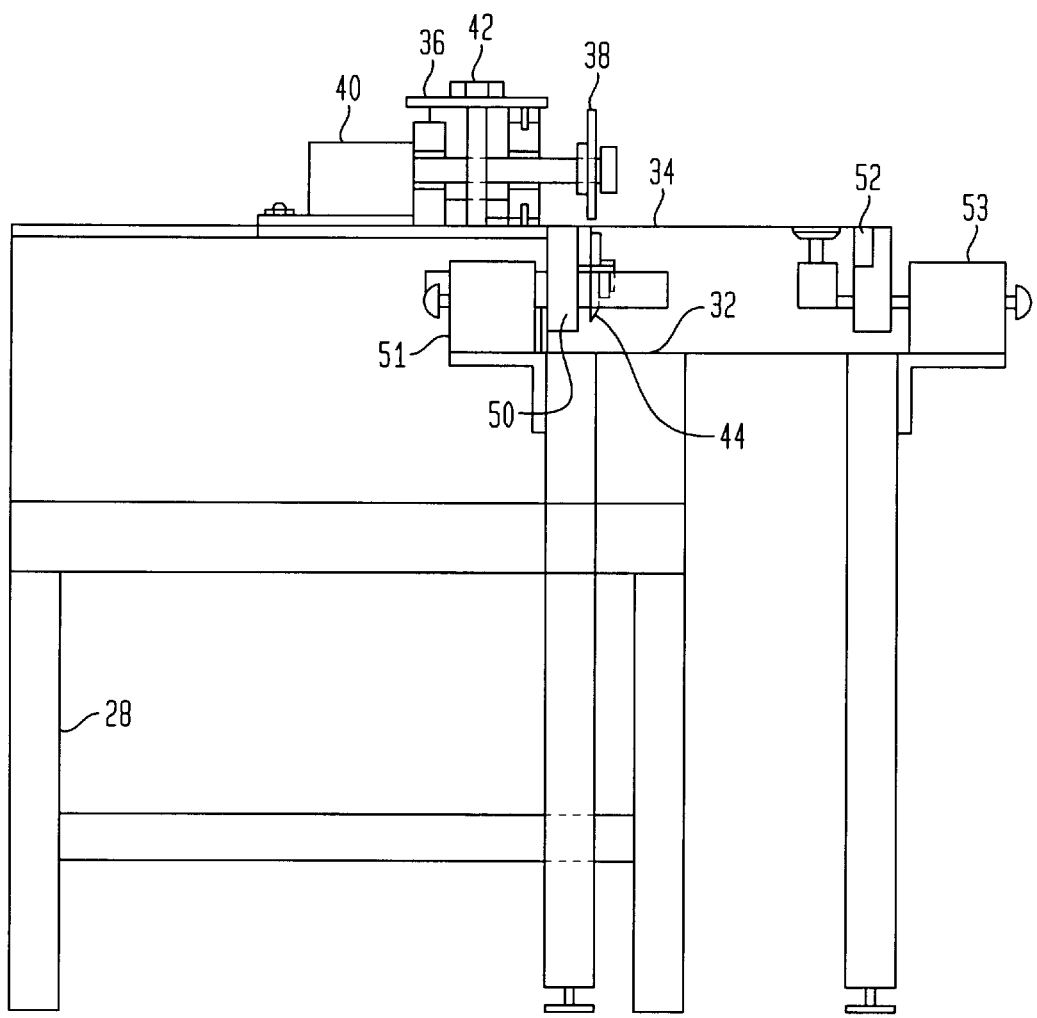
FIG. 3 is a side view of the cutting system of FIG. 2.

FIGS. 2 and 3 show plan and sides views, respectively, of a cutting system 26, in accordance with the invention, for cutting the tab 22 from the circuit board 10, both of FIG. 1. The system 26 includes a frame 28 for supporting a cutting mechanism 30 having a bed 32 that carries a conveyor 34 driven by a motor 35 and a conveyor 46 driven by a motor 48. The conveyor 34 lies in the same horizontal plane as a conveyor (not shown) that transports the circuit board 10 from an upstream fabrication station (not shown) to the cutting mechanism 30. In this way, the conveyor 34 can transport the circuit board 10 from the upstream conveyor into the cutting mechanism 30 without the need to move or even raise or lower the board as was necessary with past circuit board cutting equipment. Conveyor 46 transports the resulting circuit board sections away from the cutting mechanism 30 once the cutting operation has been preformed.

Figure 5:
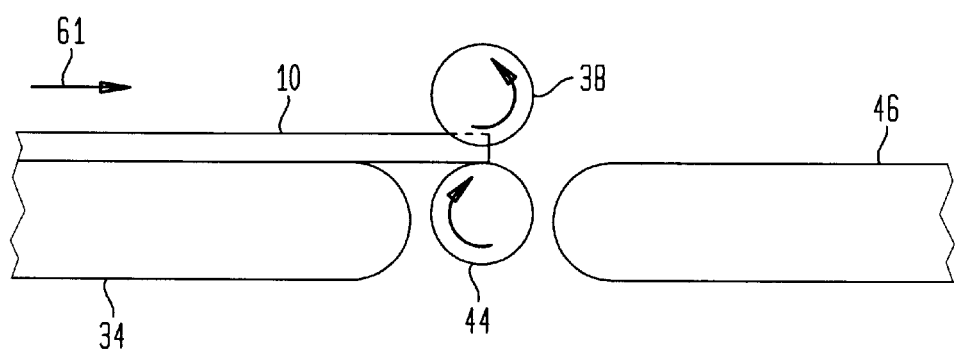
FIG. 5 is a side view of the cutting system bed.
Figure 6:
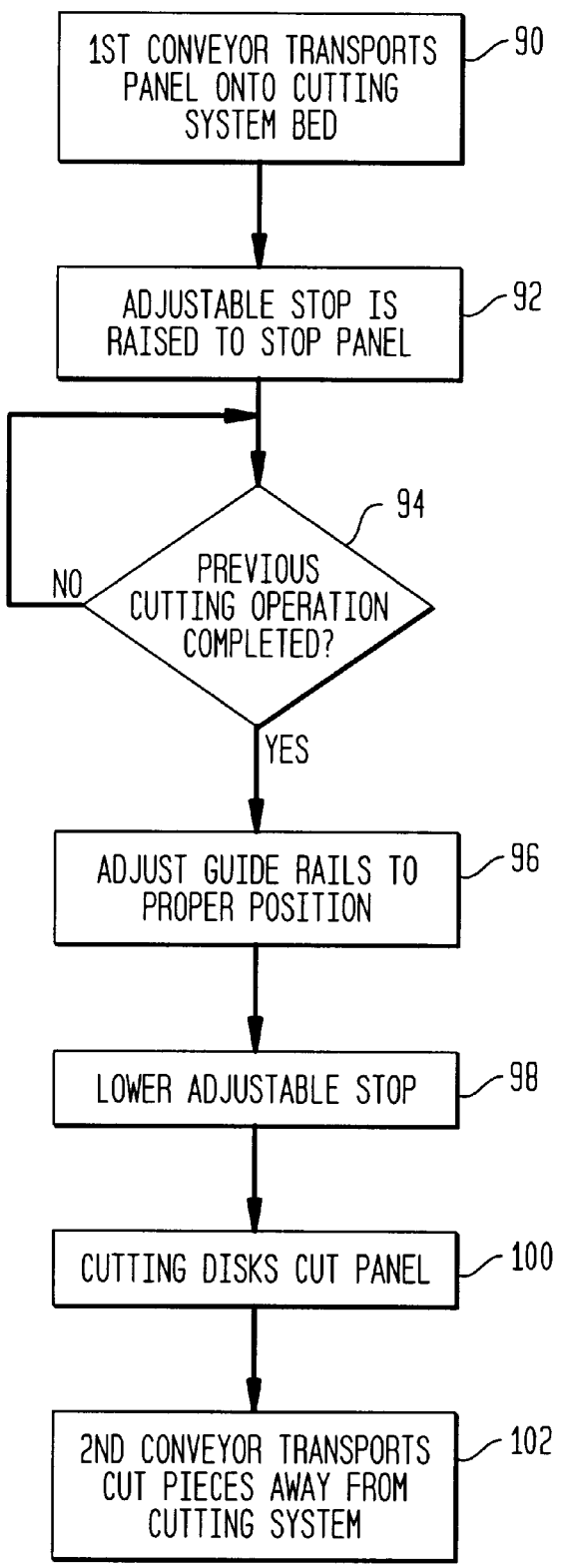
FIG. 6 is a flowchart of the cutting operation of the preferred embodiment.

As depicted in FIG. 3, the cutting mechanism 30 includes a head 36, which, contains an upper disk blade 38 that is turned by means of a cutter drive 40. The height of the upper disk blade is adjustable by means of a cutter height adjustment 42. In the preferred embodiment, this height adjustment comprises a screw-type adjustment. Below the upper surface of the conveyor 34 is positioned a lower disk blade 44 that is positioned in a manner that its cutting edge is directly below the upper cutter disk blade. The position of the lower disk blade is fixed. In practice, the cutter height adjustment is set so that the distance between the two disk blades is equal to about sixty-percent of the thickness of the board. As best illustrated in FIG. 5, the upper and lower disk blades lie between conveyor belts 34 and 46.

When the circuit board 10 is loaded onto the conveyor 34, the board is oriented so the edge to be cut 22 (see FIG. 2) is positioned to pass directly between the upper and lower disk blades. The proper positioning of the circuit board is achieved by use of adjustable guide rails, 50 and 52.

As depicted in FIG. 2 the guide rail 50 rises upwardly from the cutting mechanism bed 32 to the left of, and parallel to, the conveyor 34. The guide rail 50 is adjustable and is displaced by a motor 51. In addition, the cutting mechanism includes a second elongated guide rail 52 rising upwardly from the cutting mechanism bed and positioned to the right of, and parallel to the conveyor 34. The guide rail 52 is adjustable and is displaced by a motor 53. These guide rails are displaced to accurately guide the circuit board into the cutting mechanism.

As best seen in FIG. 2, the cutting mechanism 30 includes a pair of sensors 58 and 60 located in the cutting mechanism bed 32 upstream and down stream of the cutting head 36. The sensor 58 indicates the presence of the circuit board 10 as it enters the cutting mechanism 30, while the sensor 60 detects the board as it leaves the cutting mechanism. An adjustable stop 49 is mounted in the cutting mechanism bed 32. The stop 49 moves upwardly to stop the circuit board 10 prior to the cutting operation.

The adjustable stop 49 thus permits the system to verify that the cutting of the previous circuit board has been completed and that this previous circuit board has been transported away from the cutting mechanism — as detected by sensor 60. In addition, the sensors 58 and 60 are connected to a control system (not shown), such as a conventional programmable logic controller that actuates the guide rail motors 51 and 53 to thereby move the adjustable guide rails 50 and 52 in order to properly position the circuit board 10. Once these rails are in their proper positions, the adjustable stop 49 moves downwardly thereby allowing the conveyor 34 to transport the circuit board 10 to the cutting head 36.

Figure 4:
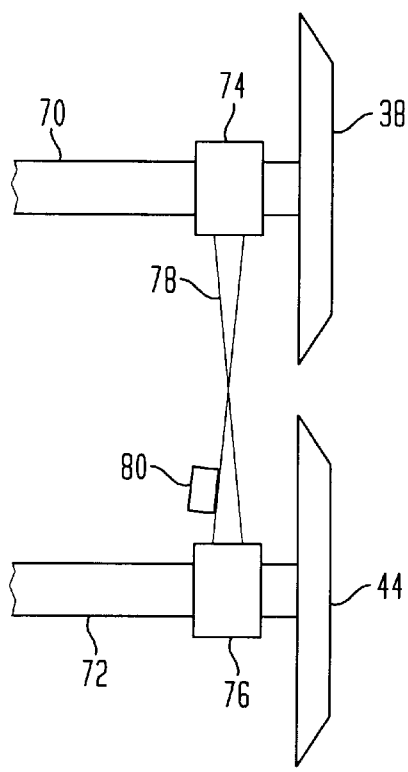
FIG. 4 is a side view of the upper and lower disk blade pulley arrangement.

As described above, the cutting head 36 comprises an upper disk blade 38 and a lower disk blade 44. As depicted in FIG. 4, each blade is mounted on a separate shaft 70 and 72, and each shaft contains a pulley 74 and 76, respectively. In the preferred embodiment shaft 70 of the upper disk blade 38 is driven by a motor 40 (as indicated in FIG. 3). A belt 78 runs between the two pulleys in such a way that the turning of shaft 70 results in shaft 72 also turning in the same direction. The cutting head also comprises a belt tensioner 80 to maintain the proper tension on the belt whenever the upper disk blade height is adjusted by the cutter height adjustment 42. A proper height adjustment and the turning of the upper and lower disk blades in the same direction as the circuit board's direction of travel 61 ensures that when the circuit board 10 is fed into the space between the disk blades 38 and 44, the turning motion of these blades both cuts the circuit board and transports it through the cutting head unto conveyor 46 (as best seen in FIG. 5).

The foregoing describes the invention with respect to the operation of performing a single cut along the entire length of a circuit board as in removing a tab running along an edge of the circuit board panel 10 of FIG. 1. As noted above, the invention also relates to performing a cutting operation upon a large panel partitioned into multiple printed circuit boards. This latter cutting operation is readily accomplished by simply reentering the cut sections of the circuit board into the system, oriented in the proper position to permit the desired second cutting.

While the invention has been described with reference to the above described embodiments, it will be appreciated by those of ordinary skill in the art that various modifications can be made to the structure and function of the individual parts of the system without departing from the sprit and scope of the invention as a whole.

I claim:

1. A method for cutting an outwardly extending tab, running along, and integral with, an edge of a panel, comprising the steps of:

a. transporting the panel along a path of a first conveyor into a cutting mechanism in line with the panel;

b. holding the panel in a stationary position prior to commencement of a cutting operation on the panel by raising an extendible stop in the path of the panel to engage a side of the panel, once the panel is transported into the cutting mechanism;

c. adjusting a left guide rail and a right guide rail after the panel has been held stationary by said extendible stop, said adjusting of the guide rails thereby properly positioning the panel for cutting;

d. releasing the panel from said stationary position by lowering said extendible stop to allow the first conveyor to move the panel through the cutting mechanism to a cutting area;

e. cutting the tab from the panel as the panel moves through the cutting area of the cutting mechanism; and f. transporting the cut panel along a second conveyor away from the cutting mechanism.

2. The method according to claim 1 wherein the cutting step comprises transporting the panel between an upper cutting disk and a lower cutting disk.

3. The method according to claim 2 further comprising the step of adjusting the upper cutter height thereby determining the distance between the upper cutting disk and the lower cutting disk.

4. The method according to claim 3 further comprising the step of sensing the panel upon transport into the cutting mechanism.

5. The method according to claim 4 wherein the step of releasing the panel includes the steps of:

g. recognizing the cutting area is clear of any previous cut panels; and h. lowering the stop.

6. The method according to claim 5 further including the step of sensing the panel as it leaves the cutting mechanism.

7. A method for cutting a circuit board panel into multiple printed circuit boards, comprising the steps of:
- a. transporting the panel along a path of a first conveyor into a cutting mechanism in line with the panel;
- b. holding the panel in a stationary position prior to commencement of a cutting operation on the panel by raising an extendible stop in the path of the panel to engage an edge of the panel, once the panel is transported into the cutting mechanism;
- c. adjusting a left guide rail and a right guide rail after the panel has been held stationary by said extendible stop, said adjusting of the guide rails thereby properly positioning the panel for cutting;
- d. releasing the panel from said stationary position by lowering said extendible stop to allow the first conveyor to move the panel through the cutting mechanism to a cutting area;
- e. cutting the panel into two sections as the panel moves through the cutting area of the cutting mechanism; and
- f. transporting the two cut panel sections along a second conveyor away from the cutting mechanism.

8. The method according to claim 7 wherein the cutting step comprises transporting the panel between an upper cutting disk and a lower cutting disk.

9. The method according to claim 8 further comprising the step of adjusting the upper cutter height thereby determining the distance between the upper cutting disk and the lower cutting disk.

10. The method according to claim 8 further comprising the step of sensing the panel upon transport into the cutting mechanism.

11. The method according to claim 10 wherein the step of releasing the panel includes the steps of:
- o. recognizing the cutting area is clear of any previous cut panels; and
- p. lowering the stop.

12. The method according to claim 11 further including the step of sensing the panel as it leaves the cutting mechanism.

* * * * *